United States Patent
Moselund et al.

(10) Patent No.: US 9,293,467 B2
(45) Date of Patent: Mar. 22, 2016

(54) RECONFIGURABLE TUNNEL FIELD-EFFECT TRANSISTORS

(71) Applicant: International Business Machines Corporation, Armonk, NY (US)

(72) Inventors: Kirsten E. Moselund, Rueschlikon (CH); Heike E. Riel, Rueschlikon (CH)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/489,949

(22) Filed: Sep. 18, 2014

(65) Prior Publication Data

US 2015/0090959 A1   Apr. 2, 2015

(30) Foreign Application Priority Data

Sep. 30, 2013 (GB) .................................. 1317265.5

(51) Int. Cl.
| | |
|---|---|
| *H01L 29/76* | (2006.01) |
| *H01L 27/11* | (2006.01) |
| *H01L 29/06* | (2006.01) |
| *B82Y 10/00* | (2011.01) |
| *H01L 29/739* | (2006.01) |
| *H01L 29/775* | (2006.01) |

(52) U.S. Cl.
CPC ............ *H01L 27/1104* (2013.01); *B82Y 10/00* (2013.01); *H01L 27/1108* (2013.01); *H01L 29/068* (2013.01); *H01L 29/0673* (2013.01); *H01L 29/7391* (2013.01); *H01L 29/775* (2013.01)

(58) Field of Classification Search
CPC ............ H01L 29/66795; H01L 29/785; H01L 29/7831; H01L 29/78648; H01L 29/78645
USPC ................................................... 257/365, 403
See application file for complete search history.

(56) References Cited

U.S. PATENT DOCUMENTS

| | | | |
|---|---|---|---|
| 7,200,037 B2 * | 4/2007 | Saito ...................... | G11C 11/16 257/E27.103 |
| 2008/0224224 A1 | 9/2008 | Vandenderghe et al. | |
| 2011/0049474 A1 | 3/2011 | Bjoerk et al. | |
| 2013/0021061 A1 | 1/2013 | Bjoerk et al. | |

FOREIGN PATENT DOCUMENTS

| | | |
|---|---|---|
| EP | 2267782 A2 | 12/2010 |
| WO | 2009128777 A1 | 10/2009 |

OTHER PUBLICATIONS

Bosnick, et al., "Transport in carbon nanotube p-i-n diodes," Applied Physics Letters, 2006, vol. 89, 163121, pp. 1-3.
(Continued)

*Primary Examiner* — Quoc Hoang
(74) *Attorney, Agent, or Firm* — Cantor Colburn LLP

(57) ABSTRACT

A tunnel field-effect transistor (TFET) device includes first and second semiconductor contact regions separated by a semiconductor channel region; a channel gate overlying the channel region; and first and second doping gates overlying the first and second contact regions respectively; wherein application of a positive voltage level at the first doping gate and a negative voltage level at the second doping gate produces an n-type first contact region and a p-type second contact region, and reversing the voltage levels at the doping gates produces a p-type first contact region and an n-type second contact region.

19 Claims, 8 Drawing Sheets

(56) References Cited

OTHER PUBLICATIONS

Heinzig, et al., "Reconfigurable Silicon Nanowire Transistors," Nano Letters, 2012, 12, pp. 119-124.

IPO Search Report; Application No. GB1317265.5; Patents Act 1977: Search Report under Section 17(5); Date Mailed: Feb. 28, 2014, pp. 1-3.
Lee, et al., "Carbon Nanotube P-N Junction Diodes," Applied Physics Letters, Jul. 5, 2004, vol. 85, No. 1, pp. 145-147.

* cited by examiner

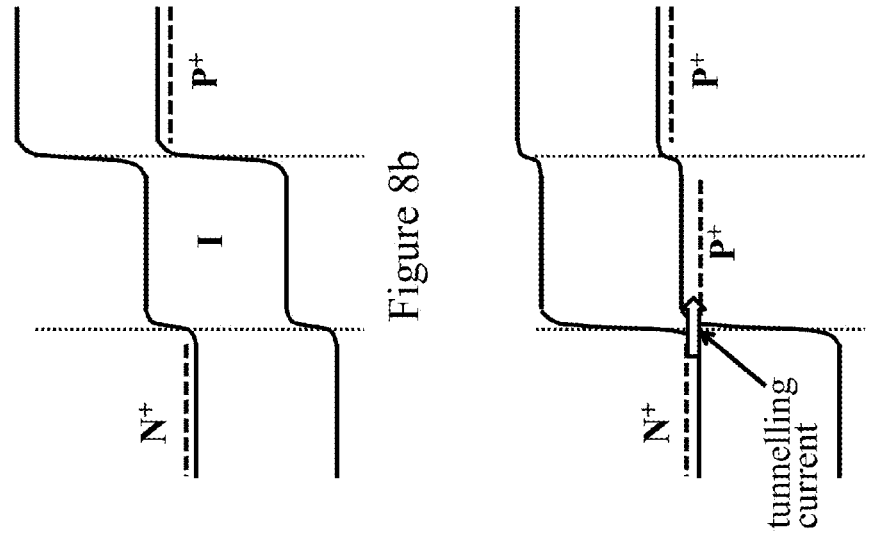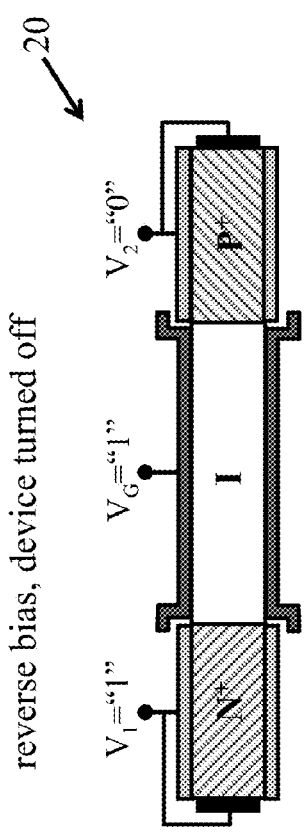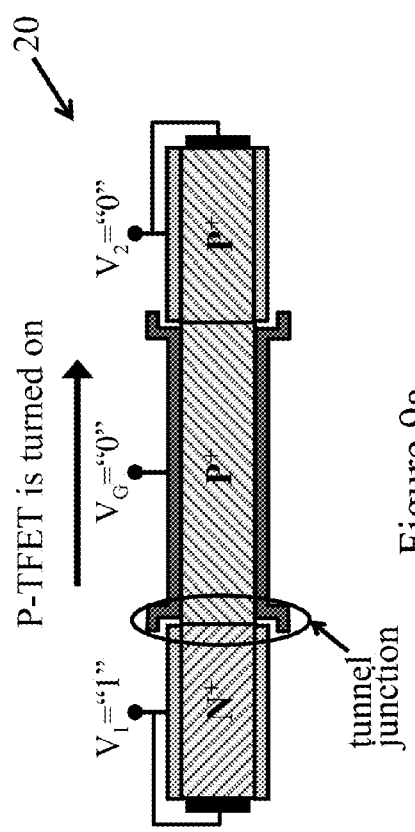
Figure 8a — reverse bias, device turned off
Figure 8b
Figure 9a — P-TFET is turned on
Figure 9b

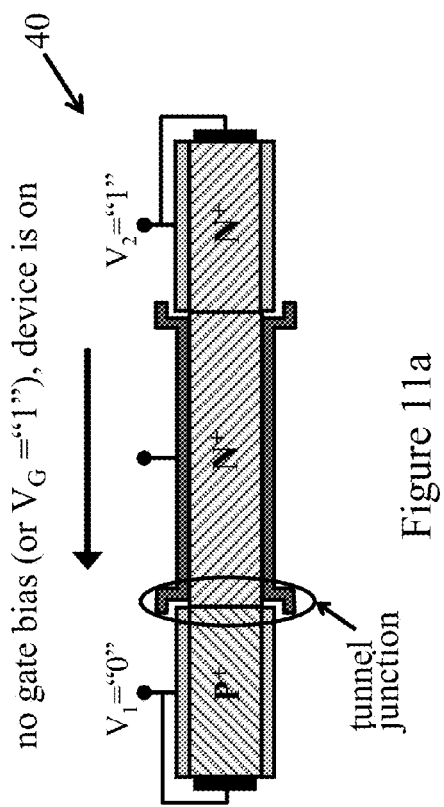
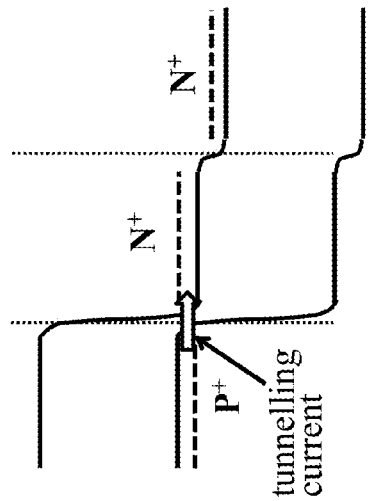
Figure 11a
Figure 11b
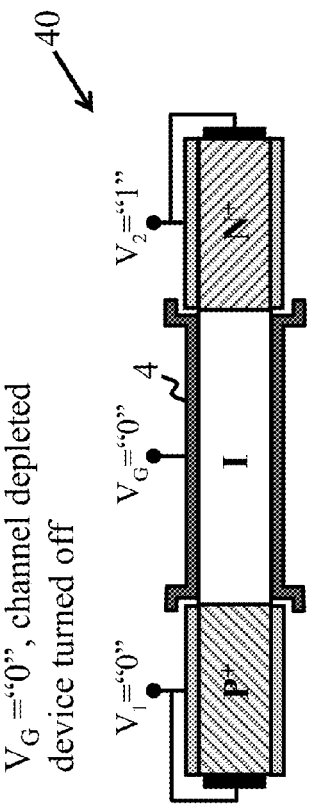
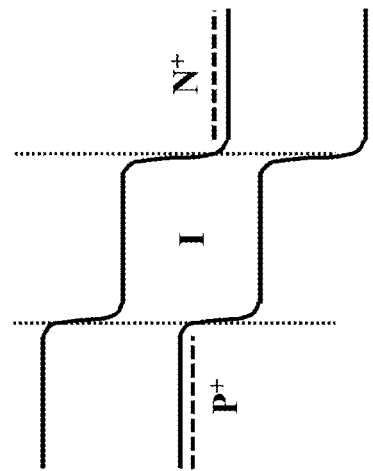
Figure 12a
Figure 12b

RECONFIGURABLE TUNNEL FIELD-EFFECT TRANSISTORS

FOREIGN PRIORITY

This application claims priority to Great Britain Patent Application No. 1317265.5, filed Sep. 30, 2013, and all the benefits accruing therefrom under 35 U.S.C. §119, the contents of which in its entirety are herein incorporated by reference.

BACKGROUND

This invention relates to reconfigurable tunnel field-effect transistors and apparatus employing such transistors.

Tunnel field-effect transistors (TFETs) are based on a pin diode or p-n diode operated in the reverse bias region. The reverse bias current exploited in these transistors is a tunneling current arising due to quantum mechanical tunneling of carriers between energy bands of source and channel regions of the TFET structure. An n-type TFET (N-TFET) has a p-type source region and an n-type drain region separated by a channel region which has an overlying gate. A p-type TFET (P-TFET) has an n-type source region and a p-type drain region separated by the gated channel region. In each case, the structure is such that application of an appropriate gate voltage to the channel region causes a shift in the energy bands of the structure, enabling band-to-band tunneling to occur between the source and channel regions.

Since operation is based on band-to-band tunneling, TFETs can operate at significantly lower power than the MOSFETs (metal-oxide semiconductor field-effect transistors) employed in CMOS (complementary metal-oxide semiconductor) technology. Low-power operation is increasingly important as technology is scaled down and device dimensions are reduced. However, unlike the symmetrical n-p-n or p-n-p structure of MOSFETs, the TFET structure is inherently asymmetric. This structural asymmetry means that bidirectional current conduction is not feasible in TFETs as illustrated in FIG. 1 of the accompanying drawing. This figure shows an illustrative example of the asymmetric output characteristic of an N-TFET due to the inherent diode between source and drain. The reverse bias tunneling current does not in principle present a threshold in a tunnel diode. In forward bias, however, the diode structure presents a threshold for the onset of the on-current, usually at a gate voltage in the range of 0.3-0.5V. Below this threshold the diode will only be able to conduct a very small current. Hence, for low values of gate bias, TFETs will conduct substantially higher currents in reverse than in forward bias. Since TFETs are targeted for low-power operation, voltages are expected to be in the sub-0.5V range to present an advantage over CMOS, i.e., below the turn-on voltage in the forward direction of the diode. Symmetrical bi-directional operation is therefore not possible.

Bidirectional transistor operation is a fundamental requirement in various circuit applications. One example is pass-gate applications where the transistor is used to selectively pass an input logic level to the output in either direction of current flow. The conventional SRAM (static random access memory) cell provides a common example of apparatus which employs pass gates. The SRAM cell comprises a pair of cross-coupled inverters connected between two signal lines by respective access transistors. The access transistors serve as pass-gates for controlling flow of current into and out of the cell during read and write operations. The asymmetry of TFETs means that they are unsuitable for use as the access transistors in this cell structure. While SRAM designs particularly suited for TFETs have been proposed, these designs involve significantly increased complexity, requiring additional transistors and/or more complex circuitry for controlling cell operation.

Doping of semiconductors to produce semiconductor devices is conventionally achieved via chemical implantation to introduce impurities into the intrinsic semiconductor material. However, electrostatic doping has also been employed in some devices. Electrostatic doping involves application of a voltage to a gate overlying a semiconductor to control carrier concentration in a region of the semiconductor beneath the gate. For example, electrostatic doping of silicon nanowires and carbon nanotubes to form p-n junctions is described in: International Patent Application publication no. WO 2009/128777 A1; "Carbon nanotube p-n junction diodes", Lee et al., Applied Physics Letters, 2004, vol. 85, pp. 145-147; and "Transport in carbon nanotube p-i-n diodes", Bosnick et al., Applied Physics Letters, 2006, 89, 163121. "Reconfigurable Silicon Nanowire Transistors", Heinzig et al., Nano Letters, 2012, 12, p. 119-124, describes use of electrostatic doping to program the channel of a silicon nanowire FET to either n-type or p-type, permitting dynamic configuration of either an nFET or a pFET. A first gate is used to control channel polarity and a second gate is used to control carrier concentration.

SUMMARY

In one embodiment, a tunnel field-effect transistor (TFET) device includes first and second semiconductor contact regions separated by a semiconductor channel region; a channel gate overlying the channel region; and first and second doping gates overlying the first and second contact regions respectively; wherein application of a positive voltage level at the first doping gate and a negative voltage level at the second doping gate produces an n-type first contact region and a p-type second contact region, and reversing the voltage levels at the doping gates produces a p-type first contact region and an n-type second contact region.

In another embodiment, a static random access memory (SRAM) cell includes a pair of access transistors, each of which is connected to a respective signal line configured to control read and write operations, wherein each access transistor comprises a tunnel field-effect transistor (TFET) device, with each TFET device further comprising first and second semiconductor contact regions separated by a semiconductor channel region, a channel gate overlying the channel region, and first and second doping gates overlying the first and second contact regions respectively, wherein application of a positive voltage level at the first doping gate and a negative voltage level at the second doping gate produces an n-type first contact region and a p-type second contact region, and reversing the voltage levels at the doping gates produces a p-type first contact region and an n-type second contact region; and wherein one of the contact regions for each access transistor is connected to the respective signal line.

In another embodiment, a static random access memory (SRAM) device includes a plurality of SRAM cells electrically connected between pairs of word lines and bit lines; each SRAM cell further comprising a pair of cross-coupled inverters and a pair of access transistors, each access transistor connected to a respective signal line configured to control read and write operations, wherein each access transistor comprises a tunnel field-effect transistor (TFET) device, with each TFET device further comprising first and second semiconductor contact regions separated by a semiconductor channel region, a channel gate overlying the channel region, and first and second doping gates overlying the first and second contact regions respectively, wherein application of a positive voltage level at the first doping gate and a negative voltage level at the second doping gate produces an n-type first contact region and a p-type second contact region, and reversing the voltage levels at the doping gates produces a p-type first contact region and an n-type second contact region; and wherein one of the contact regions for each access transistor is connected to the respective signal line.

BRIEF DESCRIPTION OF THE SEVERAL VIEWS OF THE DRAWINGS

Exemplary embodiments of the invention will now be described, by way of example, with reference to the accompanying drawings in which:

FIG. 2b is a schematic representation of the energy band structure of the TFET device in the state shown in FIG. 2a;

FIGS. 8a and 8b illustrate the off-state of a second TFET device according to a second embodiment the invention;

FIGS. 9a and 9b illustrate the on-state of the second TFET device;

FIGS. 11a and 11b illustrate the on-state of a fourth TFET device according to a fourth embodiment of the invention;

FIGS. 12a and 12b illustrate the off-state of the fourth TFET device;

DETAILED DESCRIPTION

Figure 1:
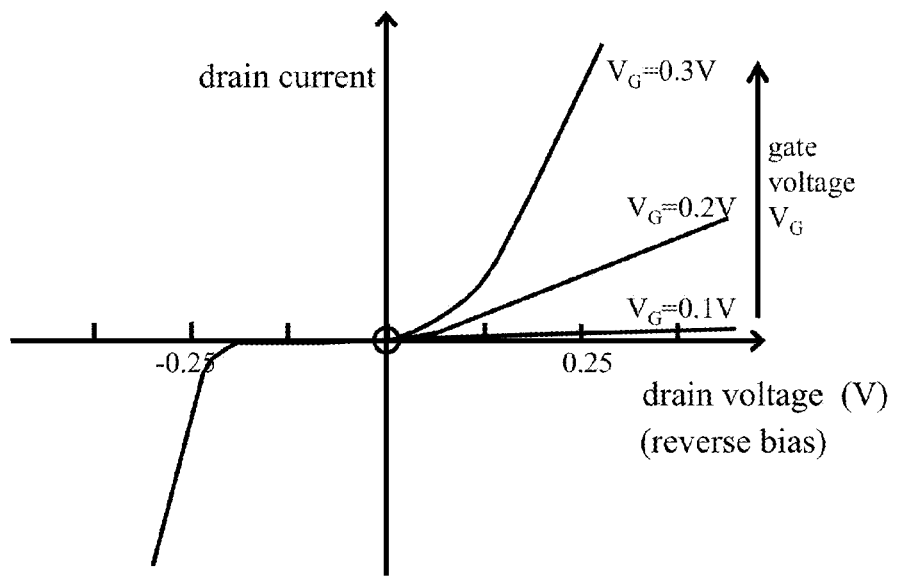
FIG. 1 shows an example of an N-TFET output characteristic.

An embodiment of a first aspect of the present invention provides a TFET device including first and second semiconductor contact regions separated by a semiconductor channel region; a channel gate overlying the channel region; and first and second doping gates overlying the first and second contact regions respectively; wherein the arrangement is such that application of a positive voltage level at the first doping gate and a negative voltage level at the second doping gate produces a TFET with an n-type first contact region and a p-type second contact region, and reversing the voltage levels at the doping gates produces a TFET with a p-type first contact region and an n-type second contact region, whereby the device is adapted for dynamically-reconfigurable bidirectional operation.

TFET devices embodying this invention are adapted for configuration as a TFET with either direction of current flow simply by reversing the voltage levels applied to the two doping gates. The structure is designed (e.g., through selection of materials, doping levels, and gate work functions for the various elements and regions of the structure) so that the resulting arrangement exhibits a band structure with an appropriate band alignment configuration on application, and reversal, of the voltage levels to provide the tunneling current necessary for TFET operation in both directions. The resulting device is thus dynamically reconfigurable to provide bidirectional TFET operation in a single structure. TFET devices embodying the invention can be used to implement pass-gates in apparatus such as SRAM circuits without requiring use of additional transistors or undue increase in circuit complexity. Moreover, the low TFET operating power means that devices embodying the invention offer circuit implementations with significantly lower power consumption than equivalent MOSFET designs.

In some embodiments, the channel region may be adapted such that formation of a tunnel junction between the channel region and the source (i.e., the contact region which is configured as the source region in use) requires application of a bias voltage to the channel gate. This may be achieved by use of a suitable (typically low to moderate) doping concentration, according to the particular material and geometry of the region, which is high enough to prevent reversal to the opposite polarity. In this case, a "normally-off" TFET is produced on application of the positive and negative voltage levels to the doping gates. In other embodiments, the channel region may be adapted such that, on application of the positive and negative voltage levels to the doping gates, a tunnel junction exists between the channel region and the source when no bias voltage is applied to the channel gate. In this case, which typically requires a high n- or p-type doping concentration, a "normally-on" TFET is produced on application of the voltage levels to the doping gates, and a bias voltage is applied to the channel gate to switch the device off. Other arrangements can be envisaged, however, as discussed in more detail below.

The first and second contact regions provide the source and drain regions of the TFET structure on application of the appropriate voltage levels at the overlying doping gates. In exemplary embodiments, each of these contact regions comprises a substantially undoped semiconductor, i.e., a semiconductor which is intrinsic or subject to a sufficiently low level of doping that it is effectively non-conductive (in the absence of applied voltage at the doping gate) and can be converted to either n- or p-type by application of the appropriate voltage level at the overlying doping gate.

A reverse bias can be applied to the device in use via first and second contact electrodes connected to the first and second contact regions respectively. In some embodiments, at least one (and most preferably each) of the doping gates is shorted to the corresponding contact electrode, i.e., the electrode which is connected to the contact region underlying that doping gate. While not necessary for device operation, shorting the doping gates to the corresponding contact electrodes reduces device area as only one contact pad per contact region is then required to activate the contact regions and bias the device in use. Hence, the reconfigurable TFET provided by such embodiments should not take up significantly more space than a conventional TFET.

In particularly simple embodiments, the channel region and the contact regions can be formed from the same semiconductor material (though the channel region may then be subject to additional doping). In other embodiments, the channel region and the contact regions can be formed in a heterostructure, whereby at least one of the regions is formed from a different material to others. Such a heterostructure can be adapted to enhance operating characteristics as explained further below.

In exemplary devices, the channel region and the contact regions are formed in a nanostructure, i.e., a structure having at least one dimension on the nanoscale (from about a nanometer up to hundreds of nanometers). In general, any nanoscale geometry can be employed here. However, the nanostructure conveniently comprises a nanowire, where the nanowire may have any desired cross-sectional geometry and may take the form of a nanotube or a nanoribbon. Alternative embodiments may employ a planar nanostructure.

An embodiment of a second aspect of the invention provides apparatus comprising at least one TFET device according to the first aspect of the invention, and control circuitry for selectively applying the positive and negative voltage levels to (a) the first and second doping gates respectively and (b) the second and first doping gates respectively.

An embodiment of a third aspect of the invention provides an SRAM cell having a pair of access transistors each of which is connected to a respective signal line for controlling read and write operations on the cell, wherein each access transistor comprises a TFET device according to the first aspect of the invention in which one of the contact regions is connected to the respective signal line.

An embodiment of a fourth aspect of the invention provides memory comprising a plurality of SRAM cells according to the third aspect of the invention.

An embodiment of the invention also provides a TFET device according to the first aspect of the invention, the device being connected in a circuit for selectively applying the positive and negative voltage levels to (a) the first and second doping gates respectively and (b) the second and first doping gates respectively, whereby the device is dynamically reconfigured for bidirectional operation in use.

In general, where features are described herein with reference to an embodiment of one aspect of the invention, corresponding features may be provided in embodiments of another aspect of the invention.

Figure 2B:
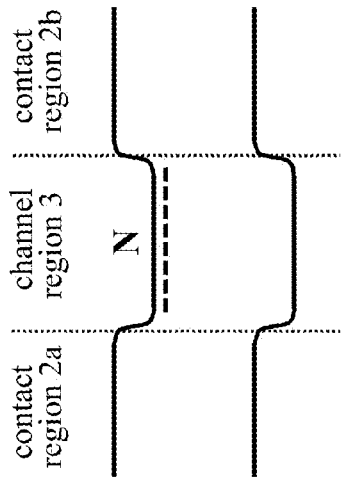
Figure 2A:
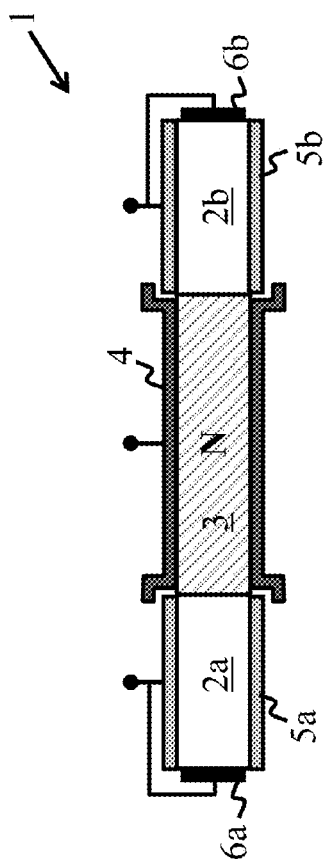
FIG. 2a is a schematic illustration of a first TFET device according to an embodiment of the invention.

FIG. 2a is a schematic cross-sectional view of a first TFET device 1 embodying the invention. The device 1 has first and second contact regions 2a and 2b which are separated by a channel region 3. The contacts regions 2a, 2b and the channel region 3 are formed by sections of a semiconductor nanowire in this embodiment. The contact regions 2a and 2b are formed by substantially undoped regions of the nanowire. That is, these regions consist of the intrinsic semiconductor material or are subject to a sufficiently low level of doping that the material remains non-conductive and can be converted to either n- or p-type by application of an appropriate bias voltage as described below. (The impurity concentration here depends strongly on the particular semiconductor material employed and a suitable level will be readily apparent to those skilled in the art). The device 1 of this embodiment is an n-type TFET (N-TFET) device of the normally-off type. Hence, channel region 3 comprises an n-type region formed by doping this section of the nanowire with a low to moderate doping concentration, indicated by "N" in the figure. An appropriate doping level here depends on the particular material and geometry of the region. This region can be conductive as the TFET will operate in reverse bias, but the doping concentration should be low enough such that formation of a tunnel junction requires application of a bias voltage as described below. Again, suitable doping concentrations in a given structure will be apparent to those skilled in the art.

A channel gate 4 is formed on the surface of the nanowire overlying the channel region 3. In addition, first and second doping gates 5a and 5b are formed on the surface of the nanowire overlying the first and second contact regions 2a and 2b respectively. The structure of the gates 4, 5a, 5b is described further below. Each gate 4, 5a, 5b is connected to a respective terminal, indicated schematically in the figure, for application of control signals to the structure in use. The contact regions 2a and 2b are provided with respective contact electrodes, indicated schematically at 6a and 6b in the figure, providing the source and drain electrodes for biasing the device in use. In this embodiment, each of the doping gates 5a and 5b is shorted to its corresponding contact electrode 6a, 6b as indicated in the figure.

Device 1 can be fabricated using well-known material processing techniques. The nanowire in device 1 may be formed, for example, of silicon or a lower bandgap III-V material such as InAs, and may have any convenient geometry in transverse cross-section, e.g., a generally circular cross-section. The channel gate 4 and doping gates 5a, 5b extend around the circumference of the nanowire providing a "wrap-around" gate structure in this embodiment. Each gate is schematically represented by a single layer in the figure for simplicity. As with all such gates, however, each gate comprises at least one conductive layer, e.g., of metal or polysilicon, providing a gate contact, separated from the underlying semiconductor by at least one dielectric layer, e.g., an oxide layer. While a simple gate structure may comprise only two layers, one conductive and one insulating, other possible gates structures may be formed as a stack comprising a plurality of such layers insulating layers designed according to generally known principles to improve functionality and/or tailor gate operating parameters to provide desired characteristics in the resulting device. In particular, by appropriate design of the gate work functions, in conjunction with other design parameters such as device dimensions and the material and doping levels employed for the different regions of the TFET device, the device can be adapted for bidirectional TFET operation as described in the following. Suitable design parameters for a particular implementation will be readily apparent to those skilled in the art based on the principles described herein.

FIG. 2a shows the state of device 1 with no signals applied to the gate terminals. The resulting energy band structure of the device is indicated schematically by the band-bending diagram of FIG. 2b. In this and subsequent band diagrams, the upper line indicates the conduction band, the lower line indicates the valence band, and the sections from left to right correspond to regions 2a, 3 and 2b of device 1 respectively. The dashed line indicates the Fermi level. In the state shown, the Fermi level due to electrons in channel region 3 lies below the conduction band.

Figure 3B:
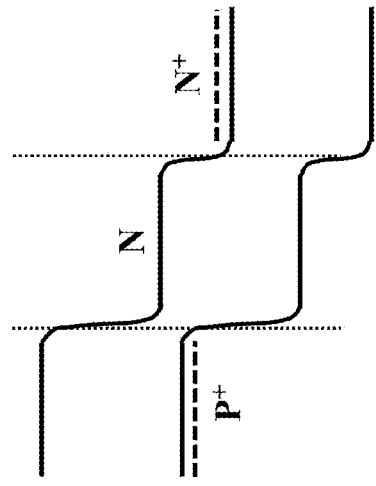
FIGS. 3a and 3b correspond to FIGS. 2a and 2b in a reverse bias state with no gate voltage.
Figure 3A:
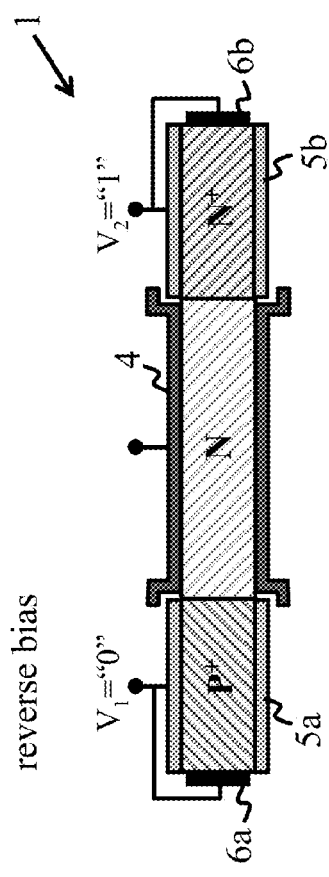

In operation of device 1, predetermined negative and positive voltage levels are applied to the terminals of doping gates 5a and 5b. In the following, the negative voltage level is denoted by logic level "0" and the positive voltage level is denoted by logic level "1". FIG. 3a shows the effect of application of the negative voltage level to the first doping gate 5a (indicated as $V_1$="0" in the figure) and the positive voltage level to the second doping gate 5b (indicated as $V_2$="1" in the figure). In the present example, this results in a strongly p-type ($P^+$) source region 2a and a strongly n-type ($N^+$) drain region 2b due to electrostatic doping via the doping gates 5a and 5b. The device is also reverse biased by application of these voltage levels since the doping gate terminals are shorted to the corresponding contact electrodes 6a and 6b for the underlying contact regions. However, in the state shown with no bias on channel gate 4, the device is non-conductive as the doping level in channel region 3 is insufficient for formation of a tunnel junction with any significant current flow between the source and drain in the reverse biased diode. The corresponding energy band diagram in this state is illustrated in FIG. 3b.

Figure 4B:
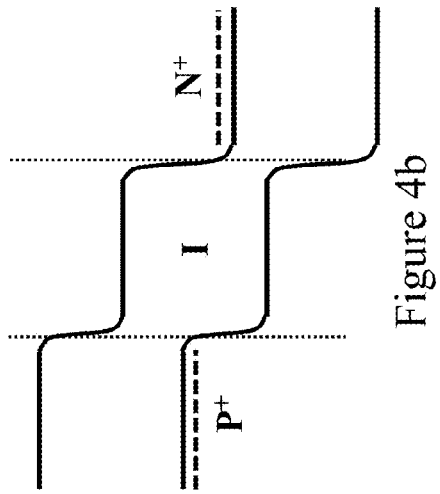
FIGS. 4a and 4b correspond to FIGS. 3a and 3b in the off-state of the device.
Figure 4A:
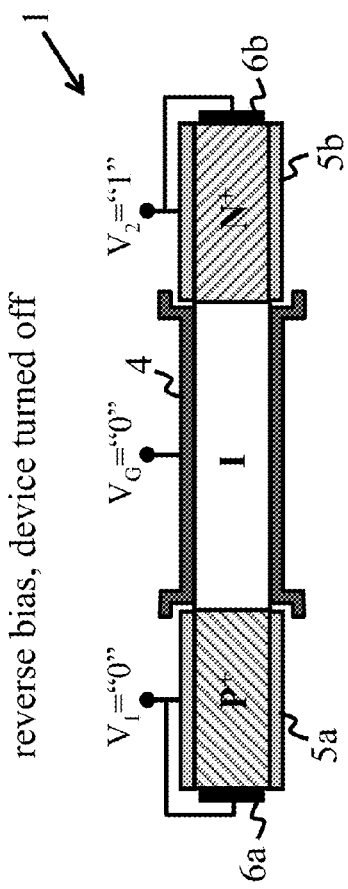

FIG. 4a shows the state of device 1 with a negative bias voltage $V_G$ (in this case the voltage level applied to doping gate 5a) applied to the channel gate terminal, i.e., $V_G$="0". Electrons are repelled away from channel gate 4 resulting in a channel region 3 with reduced conductivity, indicated as an intrinsic (I) channel region in the figure. (However, the channel region could also be p-type here, but with insufficient band-bending to cause tunneling at the junction of the channel and $N^+$ regions). In this state, device 1 is configured as a TFET in the off-state, and the corresponding band diagram is shown in FIG. 4b.

Figure 5B:
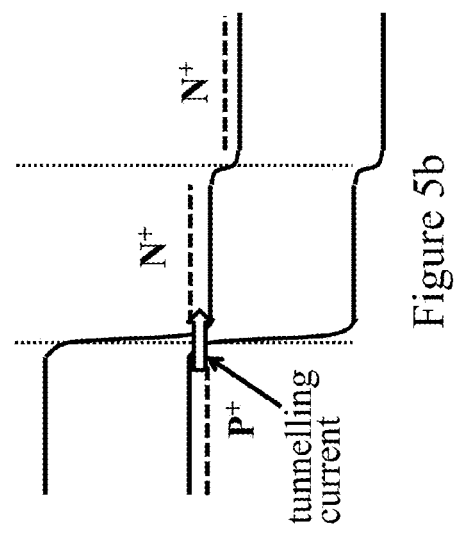
FIGS. 5a and 5b correspond to FIGS. 3a and 3b in the on-state of the device.
Figure 5A:
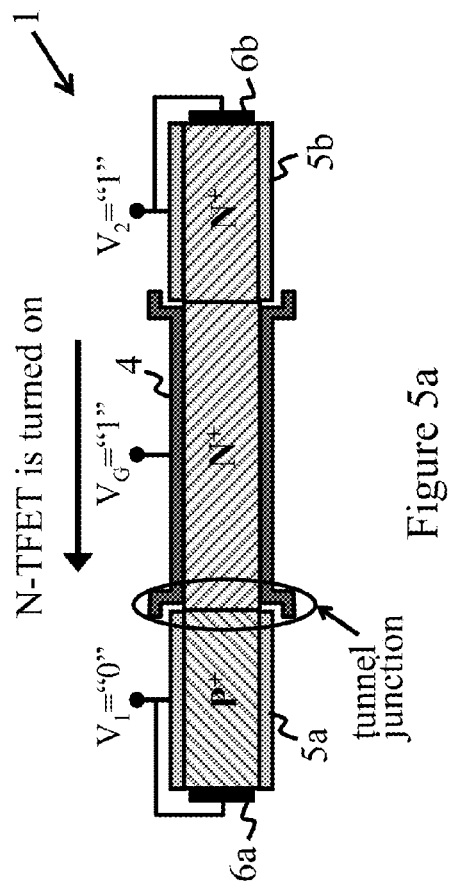

When a positive gate bias (in this case the voltage level applied to doping gate 5b,) is applied to the channel, i.e., $V_G$="1", the channel conductivity is increased corresponding to a highly-doped, $N^+$ channel region as indicated in FIG. 5a. The energy bands are pulled down relative to the source as indicated in FIG. 5b. In particular, the channel conduction band is pulled below the source valence band and a window for tunneling opens up, permitting tunneling of carriers between empty states in the valence band of the source and filled states in the conduction band of the channel as indicated by the arrow in FIG. 5b. The N-TFET is thus turned on, with a current flow direction (from positive to negative) due to the tunneling effect as indicated by the arrow in FIG. 5a.

Figure 6B:
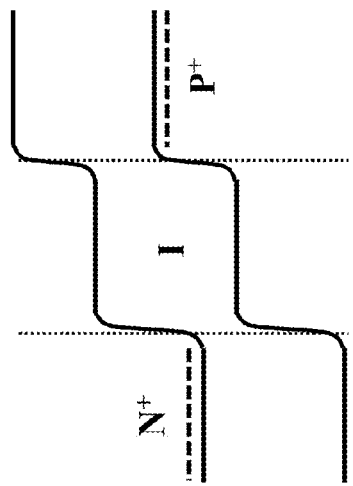
FIGS. 6a and 6b correspond to FIGS. 4a and 4b with the device reconfigured for the opposite direction of current flow.
Figure 7B:
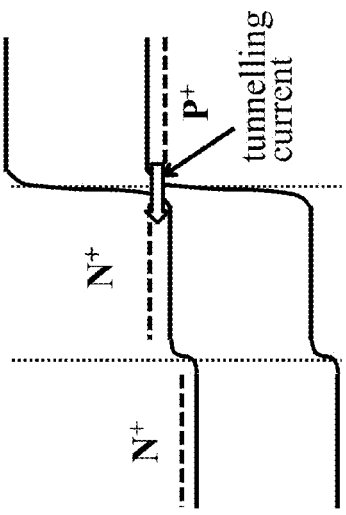
FIGS. 7a and 7b correspond to FIGS. 5a and 5b with the device reconfigured for the opposite direction of current flow.
Figure 6A:
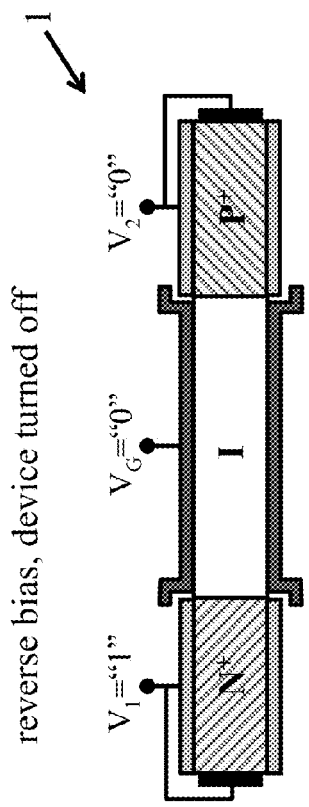
Figure 7A:
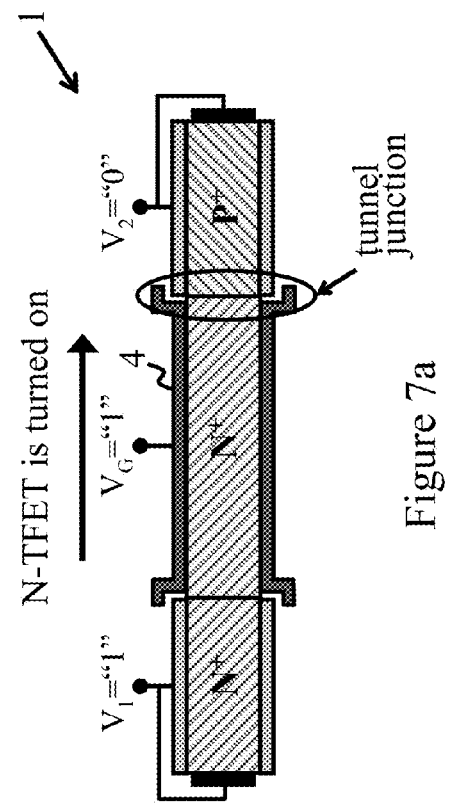

The effect of reversing the voltage levels applied to doping gates 5a, 5b is illustrated in FIG. 6a. This shows the device state with $V_1$="1" and $V_2$="0" for a negative gate bias on the channel ($V_G$="0"). Electrostatic doping of the contact regions via the doping gates then results, in this example, in a strongly n-type ($N^+$) drain region 2a and a strongly p-type ($P^+$) source region 2b. The device is again reverse biased by application of these voltage levels to respective contact electrodes 6a and 6b. Once again, the device is non-conductive with $V_G$="0", so that the device 1 is again configured as a TFET in the off-state. The corresponding band diagram is shown in FIG. 6b. However, with $V_G$="1" applied to the channel gate, the channel conduction band is again pulled below the source valence band as indicated in FIG. 7b. A tunneling current then flows across the tunnel junction formed between the source and channel as indicated in the figures. The N-TFET is thus turned on, but with current flow in the opposite direction to before as indicated by the arrow in FIG. 7a.

It will be seen from the above that device 1 can be configured to produce a TFET with either an n-type first contact region and a p-type second contact region, or a p-type first contact region and an n-type second contact region, permitting current flow in either direction. The configuration can be switched by simply reversing the voltage levels applied to the doping gates, whereby the device is adapted for dynamically-reconfigurable bidirectional TFET operation.

While device 1 is an N-TFET device, a P-TFET device can be produced for example simply by reversing the polarity of the doping applied to the channel region. That is, the channel region can be formed by moderate p-type doping of this region. An n-type contact region provides the source of such a device and a p-type contact region provides the drain. FIGS. 8a and 9a illustrate such a P-TFET device 20 in the off state and on state respectively. In this case, the channel region is formed by p-type doping of this region with a low to moderate doping concentration such that only a negative gate voltage, $V_G$="0", is sufficient to induce a tunnel junction at the $N^+$ source/$P^+$ channel junction. The off-state is achieved with a positive gate bias voltage, $V_G$="1", applied to the channel as shown in FIG. 8a. This reduces conductivity in the channel region and gives a band configuration as shown in FIG. 8b. Application of a negative gate bias, $V_G$="0", to the channel causes sufficient band-bending corresponding to a highly-doped, $P^+$ channel region as indicated in FIG. 9a. The energy bands are then pulled up relative to the n-type source as indicated in FIG. 9b. In particular, the channel valence band is lifted above the source conduction band, permitting tunneling of electrons across the source/channel tunnel junction as indicated by the arrow in FIG. 9b. The P-TFET is thus turned on, with a current flow direction as indicated by the arrow in FIG. 9a. By reversing the voltage levels applied to the doping gates so that $V_1$="0" and $V_2$="1", the device can be dynamically reconfigured as a P-TFET with the opposite direction of current flow.

The change of low to moderate doping polarity in the channel is only one among several methods to ensure unipolar conduction with respect to the gate bias. That is, the intention here is to make sure that the device only conducts for one type of gate bias, so that it is possible to turn on and off the current flow in the device. Other approaches to achieve the same goal could be, but are not limited to: work-function engineering of the gate stack, use of multilevel logic, or using a normally-on device, as described below, where a bias must be applied to turn off the current flow. Also, the drain region need not be strongly doped by the electrostatic doping as in the above example. The voltage applied to the doping gates controls the doping concentration. The drain region doping concentration can be lower than that of the source region in order to avoid ambipolar operation.

Figure 10:
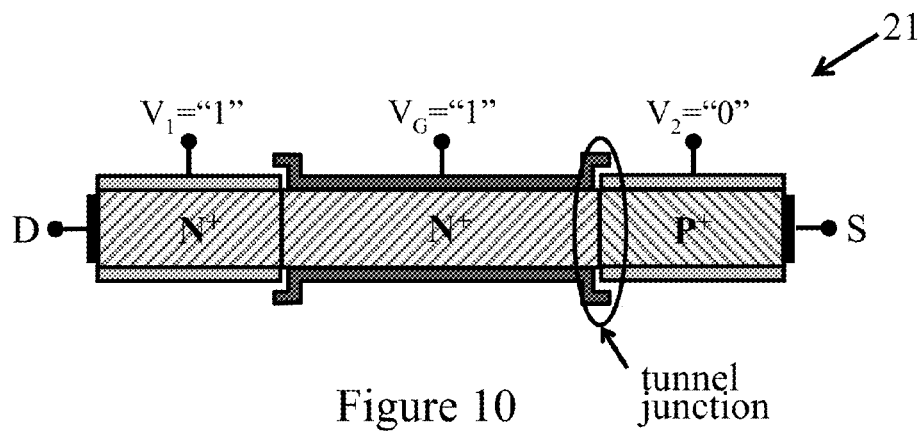
FIG. 10 shows a third TFET device according to a third embodiment of the invention.

Shorting of the doping gates to the source/drain contacts in the above embodiments minimizes die area since a single contact pad can be shared by each doping gate and its corresponding contact region. This is not, however, necessary for device operation. FIG. 10 shows an alternative N-TFET device 21 corresponding generally to device 1 above but having independent source and drain contact terminals S, D. This offers increased flexibility with respect to threshold voltage adjustment, allowing the device to be driven with different voltage levels at the source/drain terminals than those used for doping of the contact regions. This arrangement also offers the option of forward biased device operation should this be required in particular scenarios. The use of separate contacts may possibly also be more robust with respect to glitches caused by undetermined state following switching.

The above embodiments employ TFETs of the "normally off" type in which the doping concentration in the channel region is such that formation of a tunnel junction requires application of a bias voltage to the channel gate. FIG. 11a shows an alternative device 40 which corresponds generally to device 1 but is adapted for configuration as an N-TFET of the "normally on" type. Here, the channel region is a highly-doped ($N^+$) n-type region, the doping concentration being such that the channel doping is degenerate, i.e., filled states exist in the conduction band of the channel region which are available for tunneling when no bias voltage (or a positive bias voltage $V_G$="1") is applied to the channel gate. (An appropriate doping concentration here again depends on the particular material and geometry of the region, and a suitable level for a given structure will be apparent to those skilled in the art). The band diagram for the reverse biased structure with a floating gate is thus as shown in FIG. 11b. A tunneling current flows, and the N-TFET is on, even with no channel gate bias. The device is turned off by application of a negative bias voltage, here $V_G$="0", to the channel gate as shown in FIG. 12a. This depletes the channel, shifting the energy bands as indicated in FIG. 12b, and preventing tunneling and hence current flow in the device. A P-TFET device can also, of course, be configured as a normally-on device.

Figure 13:
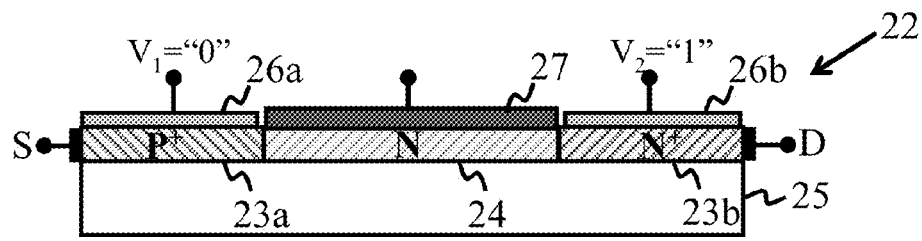
FIG. 13 is a schematic representation of a fifth TFET device according to a fifth embodiment of the invention.

The doping profiles for the different regions of the TFET device in the above embodiments are indicated in the figures as extending all the way through the transverse thickness of the nanowire. This may be the case for very thin nanowires, e.g., less than about 10 to 20 nm in thickness depending on the particular material. In other embodiments, however, the doping may be applied to a surface layer only of the corresponding region. In addition, TFET devices embodying the invention can of course use other nanowire geometries including nanotubes and nanoribbons, and can be based on structures other than nanowires. Embodiments may, for instance, employ planar device structures such as UTSOI (ultra-thin silicon on insulator) structures or two-dimensional material structures such as grapheme or MoS2 (molybdenum disulfide) structures. FIG. 13 shows a schematic representation of an exemplary TFET device with a simple planar structure. The device 22 has first and second contact regions 23a and 23b separated by a channel region 24, where the regions are formed here as surface layers in a semiconductor substrate 25. The device 22 is configured here as an N-TFET of the normally-off type, having an N-doped channel and with a P$^+$ source and N$^+$ drain formed by electrostatic doping via overlying doping gates 26a and 26b. The channel gate overlying the channel region 24 is indicated at 27. Operation of such a planar structure corresponds generally to that described above, and the various alternatives discussed in relation to the nanowire embodiments can be equally applied to planar structures.

Figure 14:
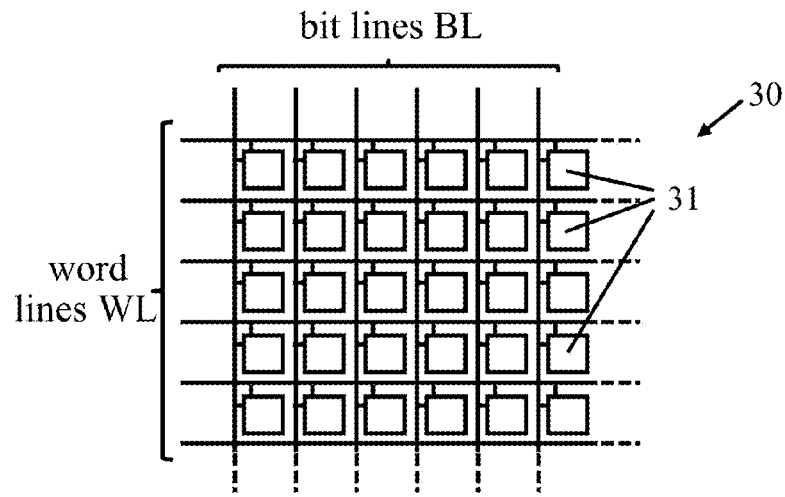
FIG. 14 is a schematic illustration of an SRAM memory array embodying the invention.

TFET devices embodying the invention can be employed to provide bidirectional TFET operation for pass gates in various apparatus. Such apparatus may utilize one or more TFET devices connected to control circuitry for selectively applying the positive and negative voltage levels to the first and second doping gates respectively as well as to the second and first doping gates respectively, thereby allowing operation in both current-flow directions. As a particular example, TFET devices embodying the invention may be employed in SRAM memory. Such a memory 30, as illustrated schematically in FIG. 14, comprises an integrated array of SRAM cells 31 electrically connected between pairs of word-lines WL and bit-lines BL via which individual cells can be accessed to perform write (programming) and read operations on the cells. A memory chip embodying memory 30 typically also includes additional circuitry (not shown) for controlling read and write operations in known manner.

Figure 15:
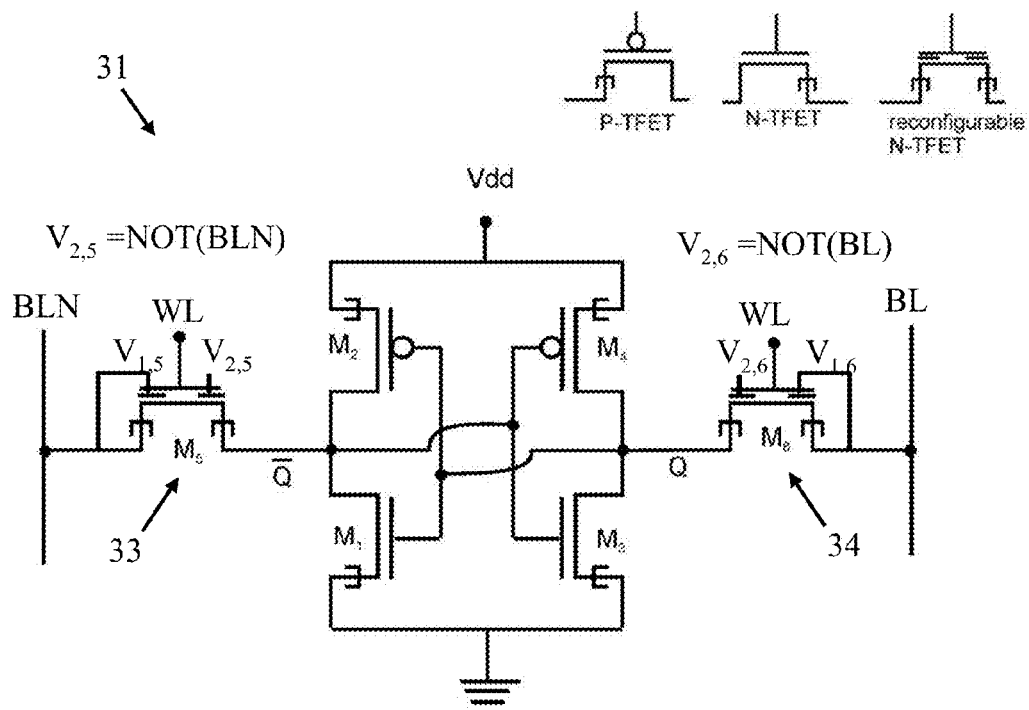
FIG. 15 illustrates circuitry of an SRAM cell in the array.

Each cell 31 in memory 30 can be implemented using TFETs as illustrated in FIG. 15. The symbols used for the different types of TFET in this circuit are indicated at the top of the figure. The square arrow in these symbols marks the source and is shown on both contacts for the reconfigurable N-TFET device. The heart of the SRAM cell 31 is formed, as usual, by a pair of cross-coupled inverters, implemented here by two N-TFETs, $M_1$ and $M_3$, and two P-TFETs, $M_2$ and $M_4$, connected to a supply voltage Vdd as indicated. The outputs of the two inverters are provided at the nodes labeled Q and $\overline{Q}$. The heart of the SRAM cell operates like a conventional MOSFET SRAM cell. The cell 31 includes a pair of access transistors, indicated generally at 33 and 34, each of which is connected to a respective signal line for controlling read and write operations on the cell. One signal line is provided by the bit-line BL for the cell, and the other signal line is labeled BLN. Each access transistor 33, 34 is implemented here by a reconfigurable N-TFET device $M_5$, $M_6$ in which one of the contact regions (at the outer side of the device in the circuit configuration shown) is connected to the respective signal line. Each N-TFET device $M_5$, $M_6$ is generally as described with reference to FIGS. 2a to 7b above, though here only one of the two doping gates is shorted to the contact electrode for the underlying contact region. In particular, the doping gate overlying the contact region connected to the signal line, (i.e., the outer doping gate in the circuit arrangement shown) is shorted to that signal line as indicated in the figure. This can be achieved, as described above, by shorting the doping gate to the contact electrode 6a, 6b for that contact region. In this embodiment, therefore, the voltage levels applied to the outer doping gate in each TFET device $M_5$, $M_6$ are defined as $V_{1,5}$=BLN and $V_{1,6}$=BL. The doping gate overlying the other contact region in each TFET device (i.e., the inner doping gate in the circuit arrangement shown) is connected (by means not shown in the figure) to receive the inversion of any signal applied to associated signal line. In this arrangement, therefore, the voltage levels $V_{2,5}$ and $V_{2,6}$ applied to the inner doping gates of devices $M_5$ and $M_6$ are defined as $V_{2,5}$=NOT(BLN) and $V_{2,6}$=NOT(BL).

Figure 16:
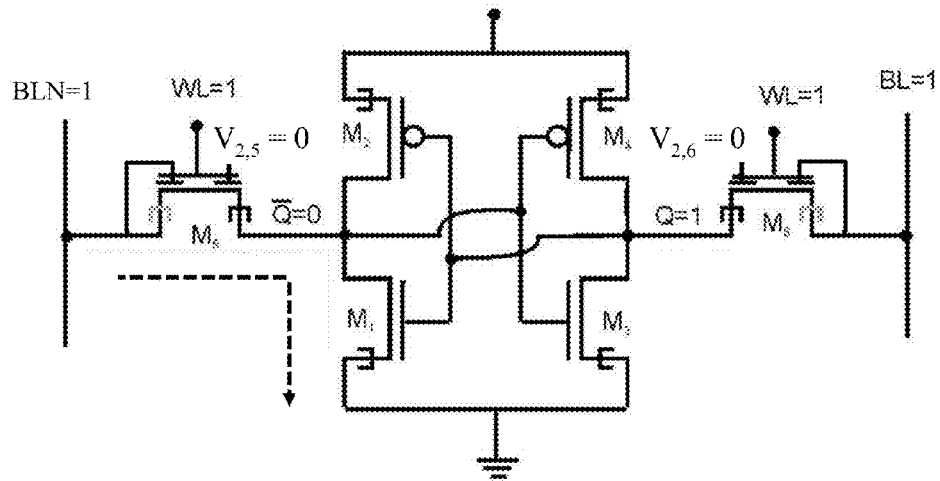
FIG. 16 indicates configuration of the cell circuitry in a read operation.

The state of cell 31 for a read operation is illustrated in FIG. 16. The read operation proceeds as follows, assuming a cell state where Q="1" and $\overline{Q}$="0". Both signal lines BL and BLN are pre-charged to "1". Asserting the word line WL will enable both access transistors $M_5$ and $M_6$. Since $V_{2,5}$=NOT(BLN), a negative potential $V_{2,5}$="0" is applied to the inner doping gate of $M_5$. $M_5$ will conduct a current working as an inwards facing TFET (with a p-doped TFET source) providing a good read margin for the read operation. The bit line BLN will be driven low, i.e., discharged through $M_5$ and $M_1$. In $M_6$, both ends of the device will see a "1", so there is no potential difference between source and drain and no current will flow. This is exactly like the situation in a conventional CMOS SRAM cell during a read operation.

Figure 17:
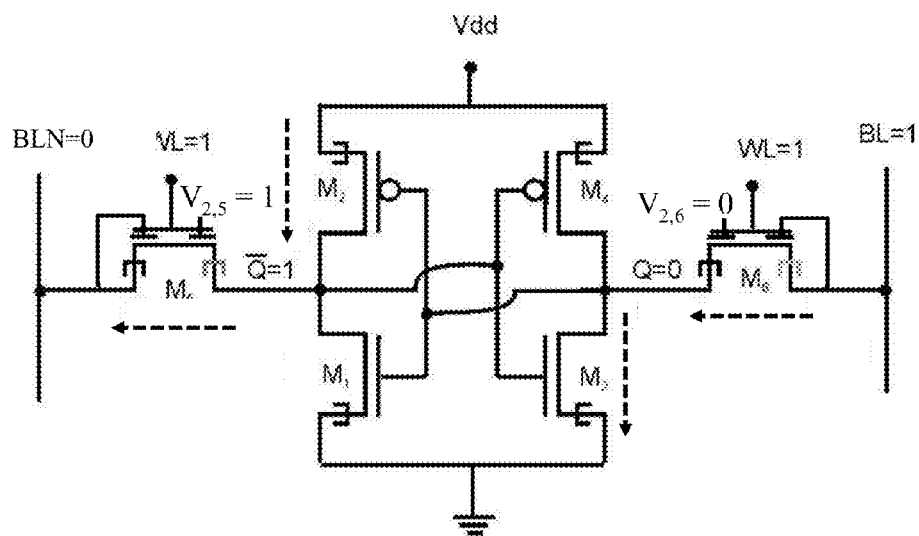
FIG. 17 indicates configuration of the cell circuitry in a write operation.

The state of cell 31 for a write operation is illustrated in FIG. 17. The write operation proceeds as follows. The value to be written to the cell is applied to the bit line BL. The other signal line BLN receives the inverted bit line signal. Hence, to write a "1", BL="1" and BLN="0". When the word line WL is asserted, the value to be stored is latched into the cell. (As with conventional SRAM cells, this works because the bit line input drivers are designed to be much stronger than the relatively weak transistors in the cell itself, and so can easily overwrite the previous state of the cross-coupled inverters). Thus, $V_{1,5}$="0", $V_{2,5}$="1", $V_{1,6}$="1", $V_{2,6}$="0". Hence, $M_6$ will pull up node Q to Q=1, while $M_5$ will pull down node $\overline{Q}$ to $\overline{Q}$="0". The resulting cell-state will then persist until the cell is re-written.

The above cell arrangement allows SRAM cells to be implemented entirely using TFETs. This permits memory operation with significantly reduced power consumption compared to equivalent CMOS designs using MOSFETs. Moreover, through dynamic reconfiguration of the TFET devices, the cells can be implemented without requiring more transistors or additional operating complexity.

While a typical 6-transistor SRAM cell design has been described here, TFET devices embodying the invention can of course implement access transistors in other cell designs. Use of the reconfigurable TFET for a pass gate access device in SRAM cells is described here as SRAM is widely used as a memory block. It will be appreciated, however, that TFET devices embodying the invention can find application in numerous other pass gate applications and, more generally, in any circuitry, including analogue circuits, where bidirectional current flow is useful.

Various other modifications can of course be made to SRAM cells embodying the invention. For example, the doping gates need not be connected to the signal lines as described above but could be controlled independently of the signal lines. Cells may also use TFET devices with other modifications discussed above, and equivalent cell designs can of course be based on P-type TFETs.

Numerous further changes and modifications can be made to the exemplary embodiments described. For example, devices might be envisaged in which the channel region is intrinsic or only lightly doped, permitting ambipolar operation where a conducting channel can be formed by applying either a positive or a negative gate bias. Such ambipolar operation may provide additional flexibility in some logic circuits. Alternatively in such embodiments, ambipolar operation could be avoided via gate stack engineering, so that the gate stack only efficiently turns on either an n- or p-channel device, or by different biasing of the source and drain regions as discussed above. Use of multilevel logic would also permit application of different gate voltage levels as required for different device configurations. In general, devices embodying the invention may use more than two logic levels for device operation if desired. Different voltage levels to those used for electrostatic doping of the contact regions may thus be used for control of the channel gate and/or biasing the source and drain contacts.

While particular examples are given above, other materials may of course be employed for the various elements of the device structure. Also, while the channel and contact regions are formed of same semiconductor material in the above examples, in other embodiments these regions could be formed in a heterostructure, such as Si—InAs or InGaAs—InGaSb for example. Hence, at least one of the regions may be formed from a different material to others. Such a heterostructure may be employed to provide beneficial characteristics. For example, the heterostructure may be designed to provide a small band gap material in the channel region with approximately equal discontinuity in the valence and conduction bands compared to the source/drain material.

It will be appreciated that many other changes and modifications can be made to the exemplary embodiments described without departing from the scope of the invention.

The invention claimed is:

1. A tunnel field-effect transistor (TFET) device, comprising:
   first and second semiconductor contact regions separated by a semiconductor channel region;
   a channel gate overlying the channel region; and
   first and second doping gates overlying the first and second contact regions respectively; and
   further comprising first and second contact electrodes connected to the first and second contact regions respectively, wherein at least one of the first and second doping gates is shorted to the corresponding contact electrode, and
   wherein application of a positive voltage level at the first doping gate and a negative voltage level at the second doping gate produces an n-type first contact region and a p-type second contact region, and reversing the voltage levels at the doping gates produces a p-type first contact region and an n-type second contact region.

2. The TFET device of claim 1, wherein the channel region is configured such that formation of a tunnel junction results from application of a bias voltage to the channel gate.

3. The TFET device of claim 1, wherein the channel region is configured such that, on application of the positive and negative voltage levels to the doping gates, a tunnel junction exists when no bias voltage is applied to the channel gate.

4. The TFET device of claim 1, wherein each of the contact regions comprises a substantially undoped semiconductor.

5. The TFET device of claim 1, wherein the channel region and the contact regions are formed from the same semiconductor.

6. The TFET device of claim 1, wherein the channel region and the contact regions are formed in a heterostructure.

7. The TFET device of claim 1, wherein each of the doping gates is shorted to the corresponding contact electrode.

8. The TFET device of claim 1, wherein the channel region and the contact regions are formed in a nanostructure.

9. The TFET device of claim 8, wherein the nanostructure comprises a nanowire.

10. The TFET device of claim 8, wherein the channel region and the contact regions are formed in a planar nanostructure.

11. A static random access memory (SRAM) cell, comprising:
    a pair of access transistors, each of which is connected to a respective signal line configured to control read and write operations, wherein each access transistor comprises a tunnel field-effect transistor (TFET) device, with each TFET device further comprising first and second semiconductor contact regions separated by a semiconductor channel region, a channel gate overlying the channel region, and first and second doping gates overlying the first and second contact regions respectively, wherein application of a positive voltage level at the first doping gate and a negative voltage level at the second doping gate produces an n-type first contact region and a p-type second contact region, and reversing the voltage levels at the doping gates produces a p-type first contact region and an n-type second contact region; and
    wherein one of the contact regions for each access transistor is connected to the respective signal line.

12. The SRAM cell of claim 11, wherein, for each TFET access device, the doping gate overlying the contact region connected to the respective signal line is shorted to that signal line.

13. The SRAM cell of claim 12, wherein the doping gate overlying the other contact region in the TFET access device is connected to receive the inversion of any signal applied to the signal line.

14. The SRAM cell of claim 13, wherein the storage cell further comprises a pair of cross-coupled inverters, each inverter including a p-type TFET device and an n-type TFET device.

15. The SRAM cell of claim 12, wherein the contact regions of each TFET access device are biased independently of the doping gates.

16. A static random access memory (SRAM) device, comprising:
    a plurality of SRAM cells electrically connected between pairs of word lines and bit lines;
    each SRAM cell further comprising a pair of cross-coupled inverters and a pair of access transistors, each access transistor connected to a respective signal line configured to control read and write operations, wherein each access transistor comprises a tunnel field-effect transistor (TFET) device, with each TFET device further comprising first and second semiconductor contact regions separated by a semiconductor channel region, a channel gate overlying the channel region, and first and second doping gates overlying the first and second contact regions respectively, wherein application of a positive voltage level at the first doping gate and a negative voltage level at the second doping gate produces an n-type first contact region and a p-type second contact region, and reversing the voltage levels at the doping gates produces a p-type first contact region and an n-type second contact region; and wherein one of the contact regions for each access transistor is connected to the respective signal line.

17. The SRAM device of claim 16, wherein, for each TFET access device, the doping gate overlying the contact region connected to the respective signal line is shorted to that signal line.

18. The SRAM device of claim 16, wherein the doping gate overlying the other contact region in the TFET access device is connected to receive the inversion of any signal applied to the signal line.

19. The SRAM device of claim 16, wherein each pair of cross-coupled inverters comprises a p-type TFET device and an n-type TFET device.

* * * * *